United States Patent
Lee et al.

(10) Patent No.: US 10,312,095 B1
(45) Date of Patent: Jun. 4, 2019

(54) RECESSED SOLID STATE APPARATUSES

(71) Applicant: TEXAS INSTRUMENTS INCORPORATED, Dallas, TX (US)

(72) Inventors: Dong Seup Lee, McKinney, TX (US); Yoshikazu Kondo, Sachse, TX (US); Pinghai Hao, Plano, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/163,602

(22) Filed: Oct. 18, 2018

Related U.S. Application Data

(63) Continuation of application No. 15/820,168, filed on Nov. 21, 2017, now Pat. No. 10,134,596.

(51) Int. Cl.
*H01L 29/205* (2006.01)
*H01L 21/28* (2006.01)
*H01L 29/423* (2006.01)
*H01L 21/02* (2006.01)
*H01L 29/778* (2006.01)
*H01L 29/51* (2006.01)
*H01L 29/66* (2006.01)
*H01L 29/20* (2006.01)

(52) U.S. Cl.
CPC .... *H01L 21/28264* (2013.01); *H01L 21/0217* (2013.01); *H01L 29/2003* (2013.01); *H01L 29/205* (2013.01); *H01L 29/4236* (2013.01); *H01L 29/42368* (2013.01); *H01L 29/518* (2013.01); *H01L 29/66462* (2013.01); *H01L 29/7787* (2013.01)

(58) Field of Classification Search
CPC ........... H01L 21/0217; H01L 21/28264; H01L 29/2003; H01L 29/205; H01L 29/4236; H01L 29/42368; H01L 29/518; H01L 29/66462; H01L 29/7787
See application file for complete search history.

(56) References Cited

U.S. PATENT DOCUMENTS 10,134,596 B1 * 11/2018 Lee ................... H01L 21/28264
2017/0207300 A1    7/2017 Pei et al.

* cited by examiner

*Primary Examiner* — Andrew Q Tran
(74) *Attorney, Agent, or Firm* — Andrew R. Ralston; Charles A. Brill; Frank D. Cimino

(57) ABSTRACT

An electronic device, that in various embodiments includes a first semiconductor layer comprising a first group III nitride. A second semiconductor layer is located directly on the first semiconductor layer and comprises a second different group III nitride. A cap layer comprising the first group III nitride is located directly on the second semiconductor layer. A dielectric layer is located over the cap layer and directly contacts the second semiconductor layer through an opening in the cap layer.

20 Claims, 5 Drawing Sheets

RECESSED SOLID STATE APPARATUSES

CROSS-REFERENCE TO RELATED APPLICATIONS

Pursuant to 35 U.S.C. § 120, this continuation application claims benefits of and priority to U.S. patent application Ser. No. 15/820,168 (TI-77891), filed on Nov. 21, 2017, the entirety of which are hereby incorporated herein by reference.

BACKGROUND

Silicon-based integrated circuits (ICs) are used in diverse areas of solid-state electronics. One such area is power electronics. In an effort to improve the system-level efficiency of power electronic systems, research efforts are being made to find other kinds of semiconductor materials that can replace silicon as a power-electronic semiconductor.

SUMMARY

According to an example embodiment an electronic device includes a first semiconductor layer comprising a first group III nitride. A second semiconductor layer is located directly on the first semiconductor layer and comprises a second different group III nitride. A cap layer comprising the first group III nitride is located directly on the second semiconductor layer. A dielectric layer is located over the cap layer and directly contacts the second semiconductor layer through an opening in the cap layer. Other embodiments include methods of forming an electronic device consistent with the described electronic device.

BRIEF DESCRIPTION OF THE DRAWINGS

For a detailed description of various examples, reference will now be made to the accompanying drawings in which.

DETAILED DESCRIPTION

Figure 1:
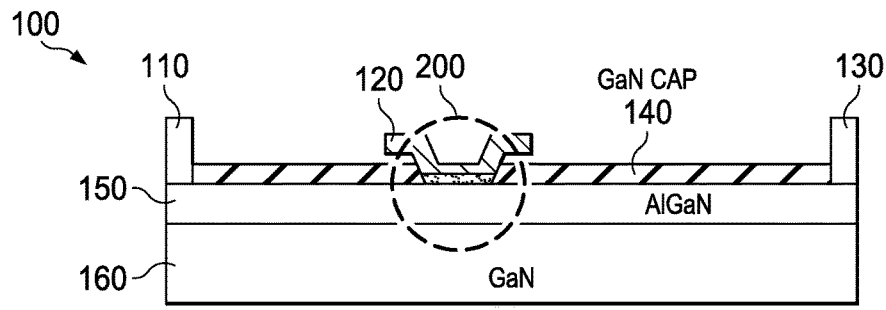
FIG. 1 is a side view of an illustrative AlGaN/GaN heterostructure field effect transistor, in accordance with various examples.

Among the materials being investigated to replace silicon as a semiconductor in power electronics are the group III nitrides. Certain characteristics (e.g., polarization) of group III nitrides can be engineered by changing their material compositions. For instance, depositing group III nitride material with a broader band-gap (e.g., AlN) on group III nitride material with a narrower band-gap (e.g., gallium nitride ("GaN")) can result in the formation of a Al(X)Ga(Y)N(Z) (where X, Y, and Z is the percentage composition of each of the corresponding element) layer. In some cases, the material composition of the Al(X)Ga(Y)In(Z)N(1-X-Y-Z) layer can be tailored to attune the bandgap of Al(X)Ga(Y)N(Z) layer. Al(X)Ga(Y)N(Z), when grown on the top of a group III nitride (e.g., GaN), can result in the formation of a 2-D electron gas ("2DEG") that has high carrier density and mobility. These features, together with the superior electrical breakdown strength of group III nitrides, make group III nitride materials strong candidates for power electronic semiconductors.

The 2DEG is enabled by the large conduction band offset of GaN and the polarization-induced charge. Spontaneous and piezoelectric polarization in the strained AlGaN/GaN heterostructure causes substantially high values for the electron sheet charge density at the interface of the AlGaN/GaN heterostructure. The interface may also be referred to as a "heterojunction." AlGaN grown on GaN may be referred to as an "AlGaN/GaN" heterostructure. In some cases, an AlGaN/GaN heterostructure can be grown on a sapphire substrate. In other cases, the substrate can be silicon carbide or gallium nitride.

Relative to silicon, GaN has a wider band-gap. Additionally, GaN-based heterostructure field effect transistors ("HFETs") can form a 2DEG based conducting path between the source and the drain of the HFET. Therefore, the HFETs are preferred over silicon-based MOSFETs, especially for power electronic applications. However, several difficulties, such as high voltage instability, carrier trapping, and reliability of the HFET should be overcome before the HFETs are commercially used. In some cases, the AlGaN/GaN HFET is prone to an unstable threshold voltage, which is the minimum gate-to-source voltage necessary to create (in enhancement mode) or deplete (in depletion mode) a conducting path between a source terminal and a gate terminal present in the HFET. The AlGaN/GaN HFET disclosed herein operates in the depletion mode.

In some cases, the AlGaN layer of the AlGaN/GaN HFET is capped with a GaN layer (also referred to as a "GaN cap layer"). The GaN cap layer prevents carrier trapping in the top layer (e.g., AlGaN) in the AlGaN/GaN heterostructure. However, in some cases, GaN cap layer can cause instability of the HFET threshold voltage, i.e., the threshold voltage drifts (e.g., decreases). An unstable threshold voltage leads to off-state leakage in the HFET. To prevent the instability of the threshold voltage, researchers have experimented with covering the top layer with different thicknesses of the GaN cap layer, yet the unstable threshold voltage and off-state leakage exists. The embodiments described herein reduce the degree of threshold voltage drift with respect to a threshold voltage value by etching a portion of GaN cap layer and creating a discontinuity in the GaN cap layer. The disclosure further describes selectively etching a portion of a GaN cap layer under the gate of the HFET, which results in the reduction of the off-state leakage current and provides a relatively stable threshold voltage.

FIG. 1 is a side view of an illustrative AlGaN/GaN HFET 100. Although the following discussion assumes a transistor comprising AlGaN/GaN that forms a 2DEG at the AlGaN/GaN interface, the disclosure may also apply to transistors made from another group III nitride which may also form a 2DEG due to amalgamation with a different group III nitride. In some examples, the AlGaN/GaN HFET 100 includes a GaN layer 160, an AlGaN layer 150, and a GaN cap layer 140. In some examples, the thickness of the AlGaN layer can be 30 nm. The thickness of the GaN cap can be 10 nm and the thickness of the GaN layer 160 can range from tens of nanometers to micrometers. The AlGaN/GaN combination results in the accumulation of 2DEG at the AlGaN/GaN interface/heterojunction. As noted above, the 2DEG is enabled by the large conduction band offset of GaN and polarization-induced charge. Spontaneous and piezoelectric polarization in the strained AlGaN/GaN heterostructure causes substantially high values for the electron sheet charge density at the interface of the AlGaN/GaN heterostructure. In some embodiments, the GaN cap layer 140 is referred to as a "barrier layer." The chemical composition of the barrier layer is not limited to gallium nitride. In some embodiments, the barrier layer can include a group III nitride or a group V nitride. In some embodiments, the barrier layer can also include an amalgamated group III-group V nitride (e.g., Al(X) Ga(Y) In(X) N(1-X-Y-Z), where X, Y, and Z is the concentration of the respective element).

The AlGaN/GaN HFET 100 further includes a source 110, a gate layer 120, and a drain 130. In some examples, the source 110 and the drain 130 are in contact through an ohmic contact (not expressly shown) with the GaN cap layer 140, AlGaN layer 150, GaN layer 160 and the 2DEG formed at the interface of AlGaN/GaN heterostructure. The gate layer 120—as further described below in detail in FIG. 2(*a*)—has a gate dielectric layer (not expressly marked in FIG. 1) between AlGaN layer 150 and the gate layer 120. For instance, a portion of the GaN cap layer 140 is etched and the gate layer 120 has no direct contact with the GaN cap layer 140 (not expressly shown in FIG. 1). Selectively etching the GaN cap layer 140 below the gate layer 120 can result in a relatively stable threshold voltage and constant off-state leakage current.

Figure 2A:
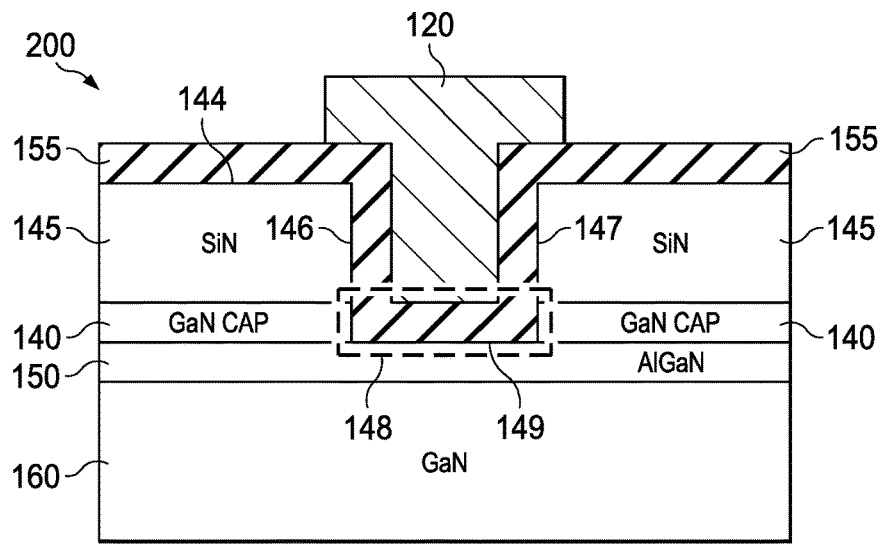
FIGS. 2(a) and 2(b) are side views of the illustrative gate portion of FIG. 1, in accordance with various examples.
Figure 2B:
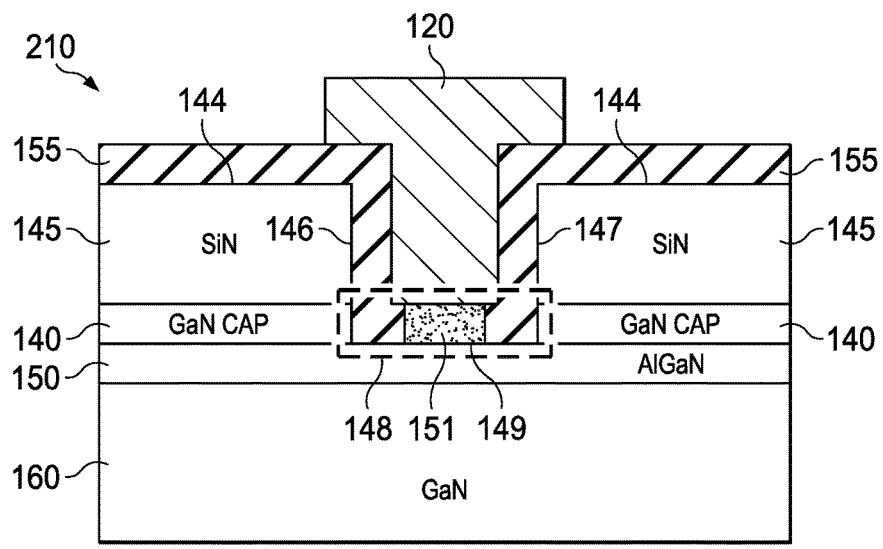
Figure 2C:
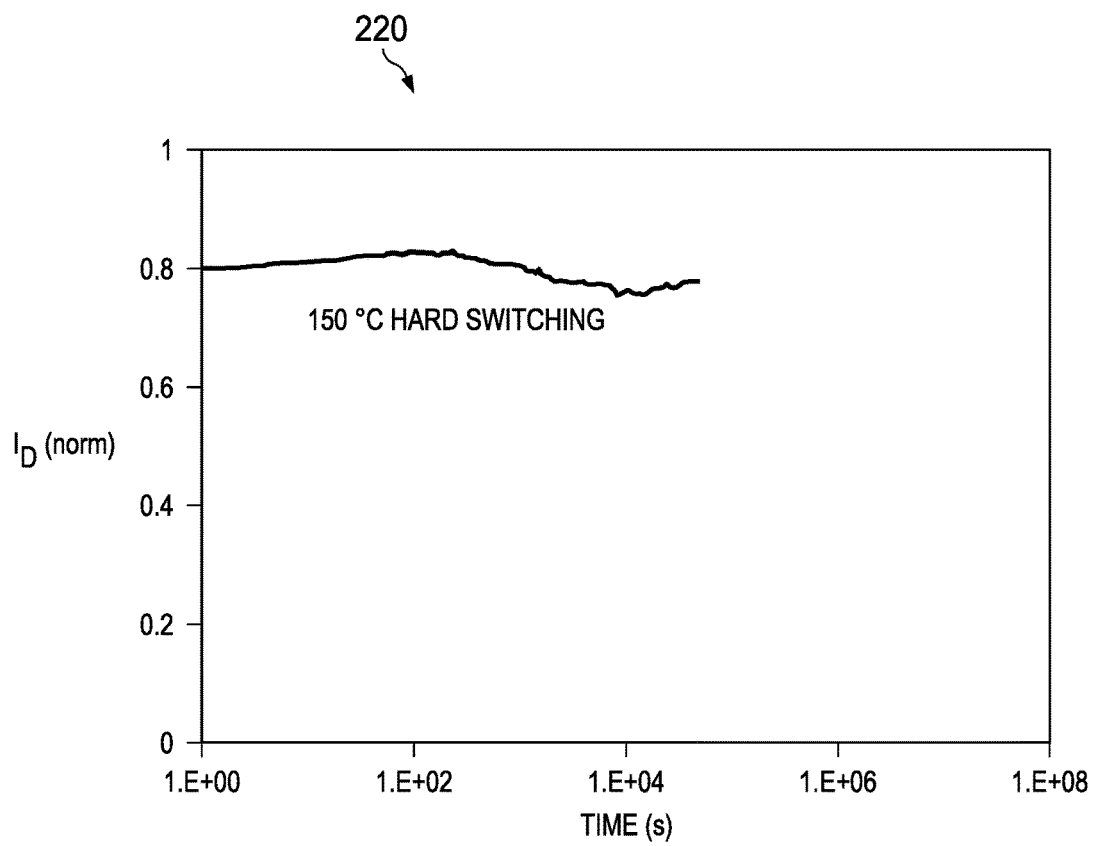
FIG. 2(c) is a graph depicting the results of an illustrative stress test performed on the devices depicted in FIGS. 1-2(a), in accordance with various examples.
Figure 3A:
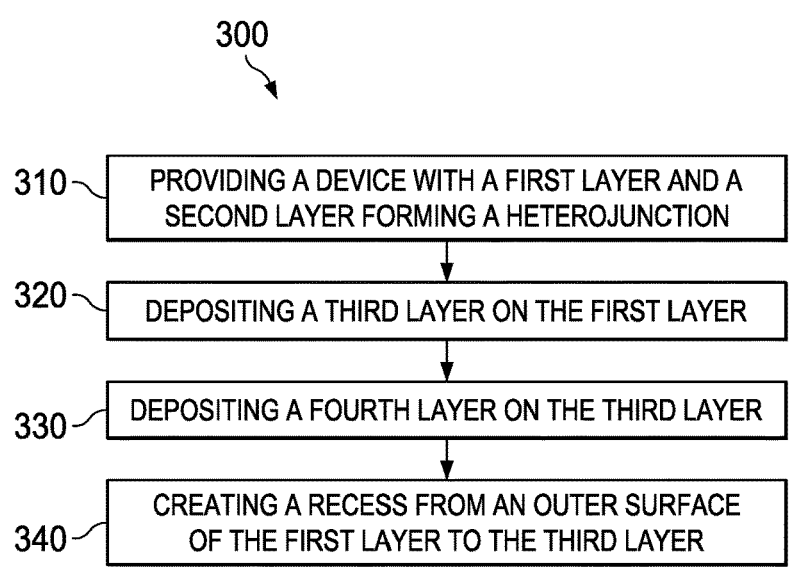
FIG. 3(a) depicts an illustrative method to selectively etch a portion of a GaN cap layer, in accordance with various examples.
Figure 3B:
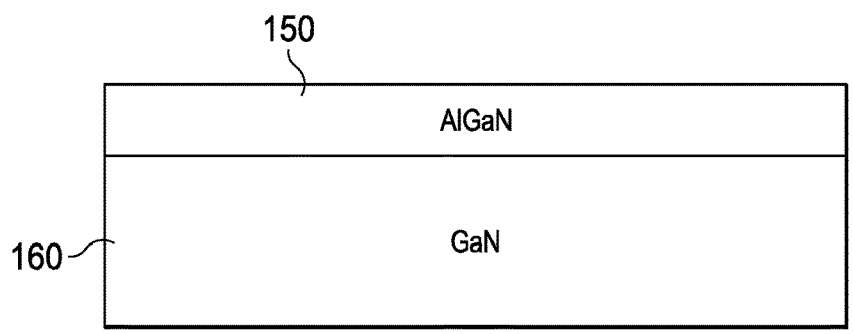
FIG. 3(b)-3(h) depict an illustrative flow diagram depicting the selective etching of a portion of a GaN cap layer under a gate layer, in accordance with various examples.
Figure 3C:
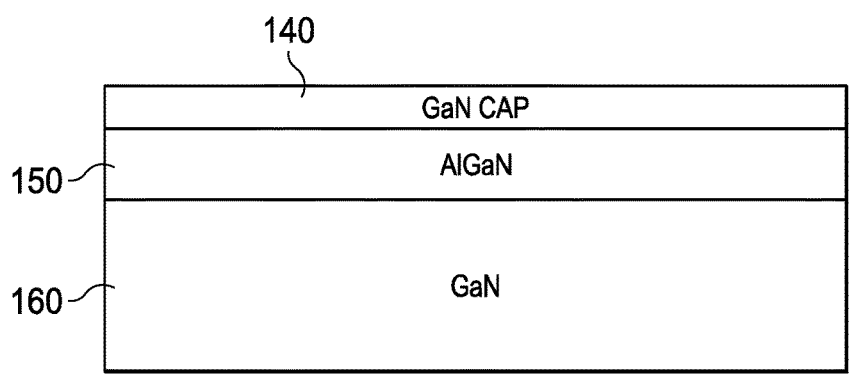
Figure 3D:
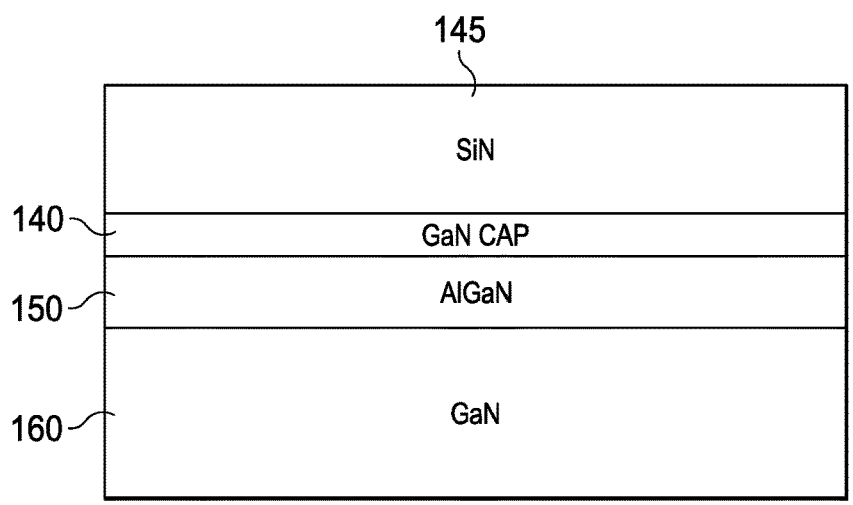
Figure 3E:
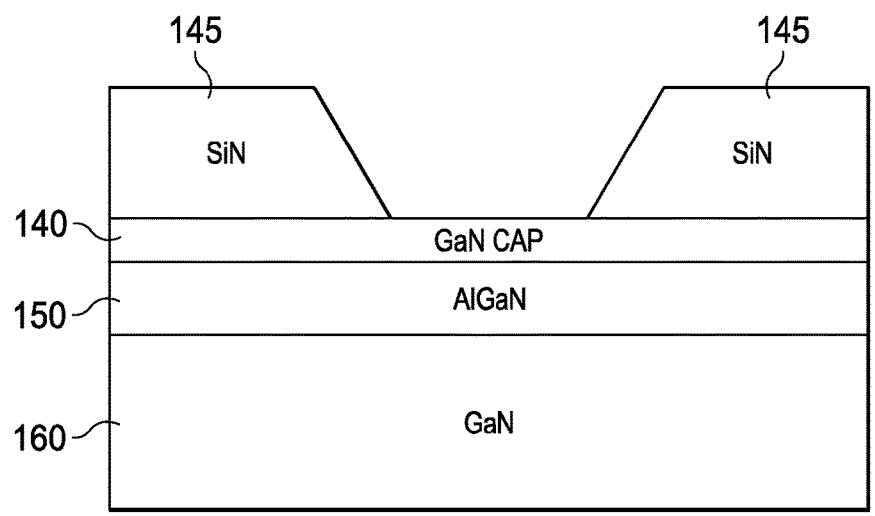
Figure 3F:
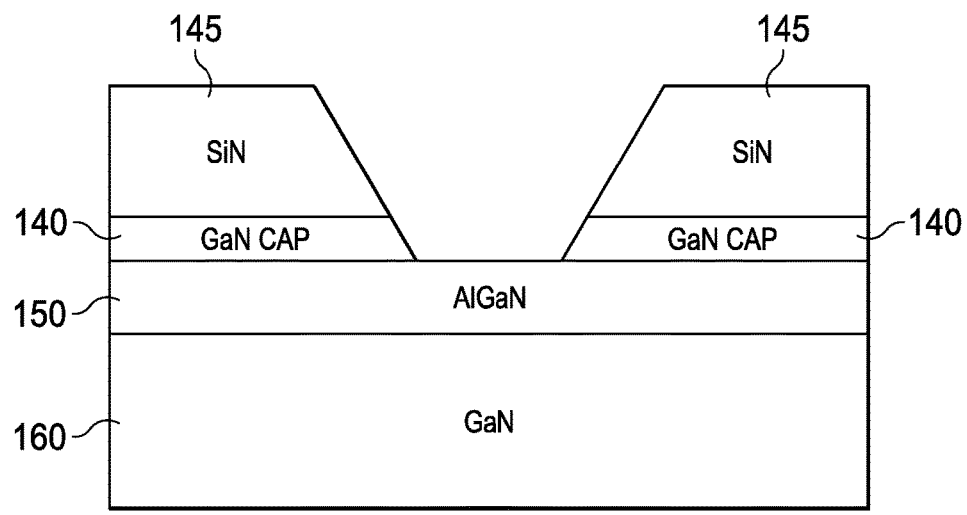
Figure 3G:
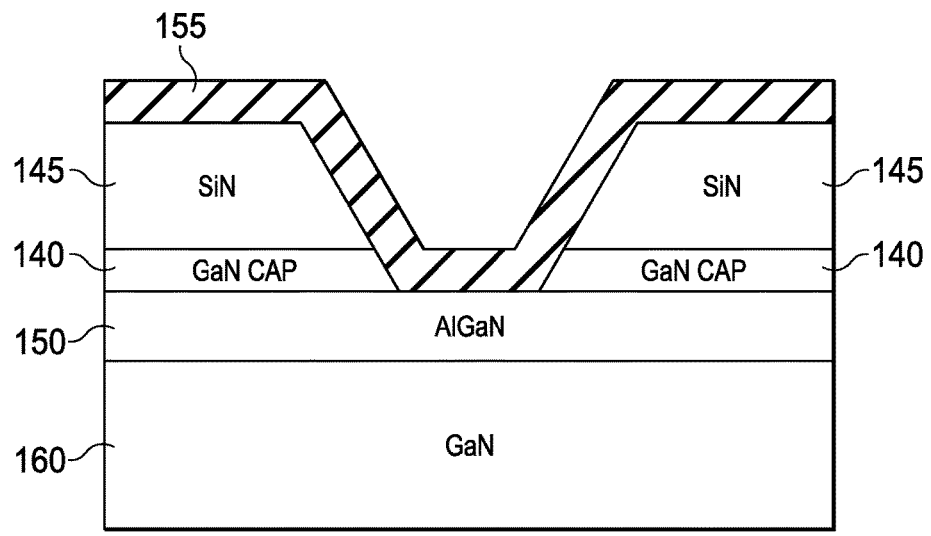
Figure 3H:
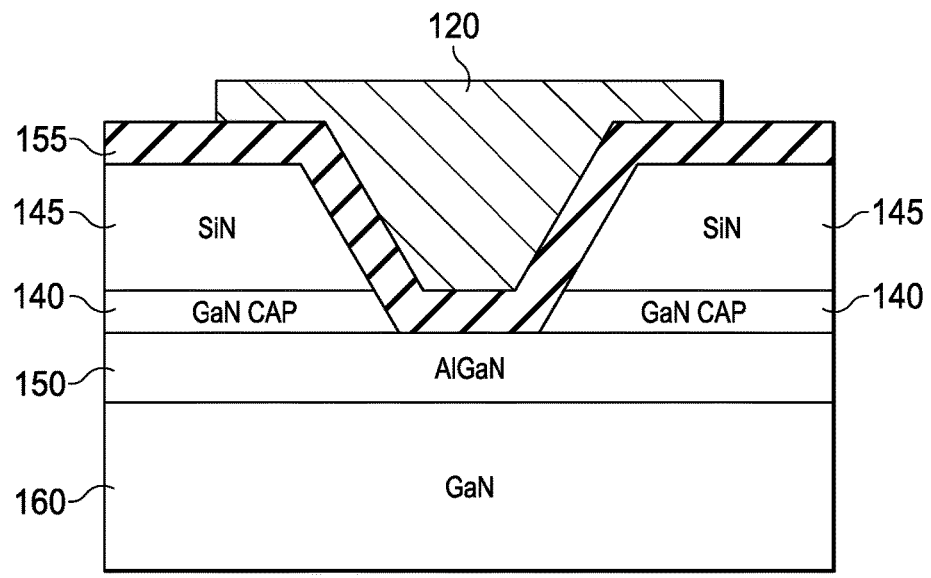

FIG. 2(*a*) depicts the gate portion marked with numeral 200 in FIG. 1, and it depicts, in detail, the layers present under the gate layer 120. FIG. 2(*a*) also illustrates the position of the gate layer 120 with respect to the other layers present in the AlGaN/GaN HFET 100. The gate portion 200 includes the gate layer 120, a gate dielectric layer 155, and a SiN (silicon nitride) layer 145. In some examples, the gate dielectric layer 155 may include silicon nitride, aluminum oxide, silicon dioxide, etc. In some examples, the dielectric layer 155 can have a thickness of 100 nm. The gate portion 200 also includes a portion of the GaN cap layer 140, the AlGaN layer 150, and the GaN layer 160 present under the gate layer 120. In some examples, the silicon nitride layer 145 includes a recess that extends from the outer surface 144 of the silicon nitride layer 145 to the top surface 149 of the AlGaN layer 150.

The recess creates a discontinuity 148 in the GaN cap layer 140. The gate dielectric layer 155 is positioned on the outer surface 144 of the silicon nitride layer 145 and extends to the discontinuity 148 along multiple additional surfaces—marked 146 and 147—of the silicon nitride layer 145. The gate dielectric layer 155 fills some or all of the discontinuity 148. The thickness of the gate dielectric layer 155 may be substantially equal (i.e., with an error range of 10% to 15%) to the thickness of the GaN cap layer 140. In some examples, the thickness of the gate dielectric layer 155 can be different than the thickness of the GaN cap layer 140. The gate layer 120 is deposited on the gate dielectric layer 155 and, in some examples, assumes either a T-shape or a Y-shape. The gate layer 120 can assume any other shape. In some examples, the GaN cap layer 140 can include multiple discontinuities. For instance, as depicted in FIG. 2(*b*), the multiple discontinuities may be positioned between each of the separate segments of the GaN cap layer 140 and a portion 151 positioned within the GaN cap layer 140. In some examples, the portion 151 present in the GaN cap layer 140 may comprise an unetched portion of the GaN cap layer 140. In some examples, the portion 151 may comprise another dielectric (e.g., SiN) that is deposited to create multiple discontinuities in the GaN cap layer 140. In some embodiments, chemical vapor deposition may be used to deposit additional discontinuities. In some examples, other types of deposition methods, such as atomic layer deposition or epitaxy deposition, can be used to deposit the portion 151. In some examples, the recess may etch some portion of the AlGaN layer (not expressly shown), which may reduce the distance between the gate layer 120 and the 2DEG formed at the AlGaN/GaN interface.

The shape of the recess is not limited to the shape or size shown in FIG. 2(*a*). The recess can assume any size or shape (e.g., square, rectangle, triangle, trapezoid) and the manufacturing process employed may be adapted to produce a recess with any such size and/or shape. In some examples, the recess shape can be contingent on the kind of etching technique (e.g., plasma etch, dry etch, chemical etch etc.) used to create the recess. The GaN cap layer 140 covered on the complete HFET and the discontinuity (or discontinuities) in the GaN cap layer 140 results in a relatively stable threshold voltage of the AlGaN/GaN HFET 100. This is because selectively etching the GaN cap layer 140 under the gate layer 120 may cause the threshold voltage to become more positive relative to the threshold voltage of a transistor fabricated using a traditional un-etched GaN cap layer. Structurally, this may be because the recess (and the removal of GaN cap layer 140) may reduce the distance between the gate and the 2DEG. This reduction in distance may further result in a relatively positive threshold voltage of the HFET 100, which may provide additional drift margin to the threshold voltage. Stated another way, the threshold voltage of the HFET 100 (including an etched GaN cap layer 140) may still drift, but selectively etching the GaN cap layer 140 may provide additional margin for the threshold voltage to drift by making the threshold voltage of the HFET 100 relatively more positive.

A stable and controlled threshold voltage can be appreciated when a hard switching stress test is performed on the AlGaN/GaN HFET 100. FIG. 2(*c*) depicts results from one such test performed on the AlGaN/GaN HFET 100 with the discontinuity 148 of FIG. 2(*a*) present under the gate layer 120. FIG. 2(*c*) depicts a graph 220 that includes time on the x-axis and a normalized drain current on the y-axis. The hard switching stress test includes an off-state stress test with the following conditions: $V_{(gate\ to\ source)} = -14V$, $V_{(drain\ to\ source)} = 600V$. The 2DEG channel is depleted under the gate layer 120—and, therefore, the channel is in the off state—under the gate layer 120 as the $V_{(gate\ to\ source)}$ is less than the threshold voltage of the AlGaN/GaN HFET 100. The hard switching stress test also includes a hot carrier stress test that turns on the AlGaN/GaN HFET 100 for a few nanoseconds while a $V_{(drain\ to\ source)}$ of 600V is applied to the drain 130. The hard switching stress test calculates the degradation in drain-to-source resistance during the off-state stress test and hot-carrier stress test. FIG. 2(*c*) depicts the output 210 of the hard switching stress test, which shows a constant leakage current that depicts a controlled and stable threshold voltage. FIG. 2(*c*) further depicts that the GaN cap layer 140 can still be used to protect the top surface of the HFET and selectively etching the GaN cap layer 140 below the gate layer 120 can result in a relatively stable threshold voltage and constant off-state leakage current.

FIG. 3(*a*) depicts an illustrative method 300 to selectively etch a portion of the GaN cap layer 140 under the gate layer 120. The method 300 disclosed in FIG. 3(*a*) is now described in tandem with FIG. 3(*b*)-FIG. 3(*h*). The method 300 begins in step 310 with providing a device with a first layer and a second layer forming a heterojunction. In some examples, the device can be a transistor including group III nitrides. In some examples, the first layer is the AlGaN layer 150 and the second layer is the GaN layer 160 forming a heterojunction at the AlGaN/GaN interface. AlGaN layer 150 forms when AlN is deposited using chemical vapor deposition on the GaN layer 160. In some examples, other types of deposition methods, such as atomic layer deposition or epitaxy deposition, can be used to deposit AlN on GaN. The AlGaN layer 150 and the GaN layer 160, due to a polarization discontinuity, forms a heterojunction including 2DEG at the AlGaN/GaN interface. The method 300 continues in step 320 (FIG. 3(c)) with depositing a third layer on the first layer. The third layer can be a GaN layer (also referred to herein as the "GaN cap layer"). As noted above, in some examples, the thickness of the GaN cap layer 140 is less than the thickness of the GaN layer 160. In some examples, the GaN cap layer 140 is utilized to prevent the trapping phenomenon by protecting the top surface (e.g., AlGaN) of the AlGaN/GaN HFET.

The method 300 continues in step 330 with depositing a fourth layer on the third layer. In some examples, a silicon nitride layer 145 is deposited on the GaN cap layer 140 as a protection layer to provide electrical isolation to the AlGaN/GaN HFET 100. The SiN layer 145 has an outer surface opposite to the surface on which the SiN layer 145 is deposited. The use of silicon nitride is not limiting, and other materials, such as silicon dioxide, aluminum oxide, etc. can also be used to provide electrical isolation. The method 300 further continues in step 340 with creating a recess extending from an outer surface of the first layer to the third layer. In some examples, the recess is created by first etching the SiN layer 145 using a plasma etching technique to expose a portion of the GaN cap layer 140 and then etching the exposed GaN cap layer 140. Etching of the SiN layer 145 is not limited to plasma etching, and other techniques, such as chemical etching techniques, can also be used to etch a portion of the SiN layer 145. Etching the exposed portion of the GaN cap layer 140 is achieved by performing a breakthrough step and a main-etch step. The breakthrough step can be performed by using boron trichloride ($BCl_3$). The breakthrough step is performed to remove native oxide from the GaN cap layer 140. Further, the main-etch step can be performed using a plasma etch process using a gas composed of a mixture of boron trichloride and sulfur hexafluoride. The recess creates a "discontinuity" in the GaN cap layer 140. In some examples, multiple discontinuities can be formed in the GaN cap layer 140 by selectively etching some portion of exposed portion of the GaN cap layer 140. Multiple discontinuities can also be formed using a similar etching process as described above.

The steps of the method 300 may be adjusted as desired, including by adding, deleting, modifying, or rearranging one or more steps. For instance, a gate dielectric layer 155 can be deposited in the discontinuity formed in the GaN cap layer 140. The gate dielectric layer 155 can also be deposited on the outer surface of the silicon nitride layer 145 and on multiple surfaces of the silicon nitride layer 145, as shown in the FIG. 3(b). Further, a gate layer 120 can also be deposited on the gate dielectric layer 155 using, e.g., a sputtering technique.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An electronic device, comprising:
   a first semiconductor layer comprising a first group III nitride;
   a second semiconductor layer located directly on the first semiconductor layer and comprising a second different group III nitride;
   a cap layer located directly on the second semiconductor layer, the cap layer comprising the first group III nitride; and
   a dielectric layer located over the cap layer that directly contacts the second semiconductor layer through an opening in the cap layer.

2. The electronic device of claim 1, wherein the first and second layers form a heterojunction at their interface.

3. The electronic device of claim 1, wherein the first and second semiconductor layers comprise gallium.

4. The electronic device of claim 1, wherein the second semiconductor layer comprises aluminum.

5. The electronic device of claim 1, further comprising an insulating layer between the dielectric layer and the second semiconductor layer, wherein the dielectric layer is located on a surface of an opening within the insulating layer.

6. The electronic device of claim 5, wherein the insulating layer comprises a first dielectric material and the dielectric layer comprises a different second dielectric material.

7. The electronic device of claim 1, further comprising a gate layer located over the dielectric layer within the opening.

8. The electronic device of claim 1, wherein the cap layer and the dielectric layer have about a same thickness within the opening.

9. The electronic device of claim 1, wherein the cap layer comprises a group V element.

10. The electronic device of claim 1, further comprising first and second contacts having respective ohmic connections to the cap layer, wherein the opening is located between the first and second contacts.

11. A method, comprising:
    providing substrate having a first semiconductor layer comprising a first group III nitride;
    forming a second semiconductor layer directly on the first semiconductor layer, the second semiconductor comprising a second different group III nitride;
    forming a cap layer directly on the second semiconductor layer, the cap layer comprising the first group III nitride; and
    depositing a dielectric layer over the cap layer, the dielectric layer directly contacting the second semiconductor layer through an opening in the cap layer.

12. The method of claim 11, wherein the first and second layers form a heterojunction at their interface.

13. The method of claim 11, wherein the first and second semiconductor layers comprise gallium.

14. The method of claim 11, wherein the second semiconductor layer comprises aluminum.

15. The method of claim 11, further comprising forming an insulating layer such that the insulating layer is located between the dielectric layer and the second semiconductor layer, wherein the dielectric layer is located on a surface of an opening within the insulating layer.

16. The method of claim 15, wherein the insulating layer comprises a first dielectric material and the dielectric layer comprises a different second dielectric material.

17. The method of claim 11, further comprising forming a gate layer over the dielectric layer within the opening.

18. The method of claim 11, wherein the cap layer and the dielectric layer have about a same thickness within the opening.

19. The method of claim 11, wherein the cap layer comprises a group V element.

20. The method of claim 11, further comprising forming first and second contacts having respective ohmic connections to the cap layer, wherein the opening is located between the first and second contacts.

* * * * *